United States Patent
Empante et al.

(10) Patent No.: US 12,094,785 B2
(45) Date of Patent: Sep. 17, 2024

(54) DUAL SILICIDE PROCESS USING RUTHENIUM SILICIDE

(71) Applicant: Applied Materials, Inc., Santa Clara, CA (US)

(72) Inventors: Thomas Anthony Empante, San Jose, CA (US); Avgerinos V. Gelatos, Scotts Valley, CA (US); Zhibo Yuan, Santa Clara, CA (US); Liqi Wu, San Jose, CA (US); Joung Joo Lee, San Jose, CA (US); Byunghoon Yoon, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 219 days.

(21) Appl. No.: 17/551,381

(22) Filed: Dec. 15, 2021

(65) Prior Publication Data
US 2023/0187282 A1 Jun. 15, 2023

(51) Int. Cl.
H01L 21/8238 (2006.01)
H01L 27/092 (2006.01)
H01L 21/285 (2006.01)
H01L 21/768 (2006.01)

(52) U.S. Cl.
CPC .... H01L 21/823814 (2013.01); H01L 27/092 (2013.01); H01L 21/28518 (2013.01); H01L 21/76843 (2013.01)

(58) Field of Classification Search
None
See application file for complete search history.

(56) References Cited

U.S. PATENT DOCUMENTS

| | | | |
|---|---|---|---|
| 7,354,849 B2 | 4/2008 | Plombon et al. | |
| 9,145,612 B2 | 9/2015 | Gandikota et al. | |
| 2006/0121665 A1 | 6/2006 | Fang et al. | |
| 2009/0315185 A1 | 12/2009 | Boyanov et al. | |
| 2015/0041918 A1 | 2/2015 | Wann et al. | |
| 2015/0162214 A1 | 6/2015 | Thompson et al. | |
| 2020/0091011 A1* | 3/2020 | Khaderbad | H01L 21/823871 |

(Continued)

FOREIGN PATENT DOCUMENTS

| JP | 2018035375 A | 3/2015 |
|---|---|---|
| KR | 20080086661 A | 9/2008 |

OTHER PUBLICATIONS

PCT International Search Report and Written Opinion in PCT/US2022/033979 dated Oct. 13, 2022, 11 pages.

(Continued)

*Primary Examiner* — Cory W Eskridge
(74) *Attorney, Agent, or Firm* — Servilla Whitney LLC

(57) ABSTRACT

Methods for forming a semiconductor structure and semiconductor structures are described. The method comprises patterning a substrate to form a first opening and a second opening, the substrate comprising an n transistor and a p transistor, the first opening over the n transistor and the second opening over the p transistor. The substrate may be pre-cleaned. A ruthenium silicide (RuSi) layer is selectively deposited on the p transistor. A titanium silicide (TiSi) layer is formed on the n transistor and the p transistor. An optional barrier layer may be formed on the titanium silicide (TiSi) layer. The method may be performed in a processing chamber without breaking vacuum.

15 Claims, 6 Drawing Sheets

(56) References Cited

U.S. PATENT DOCUMENTS

2020/0294864 A1* 9/2020 Chu ...................... H01L 27/092
2020/0343136 A1* 10/2020 Yu ....................... H01L 21/0228
2021/0193816 A1* 6/2021 Chu ........................ H01L 29/45

OTHER PUBLICATIONS

Shim Kew-Chan, et al., "Bottom-up Filling of Submicrometer Features in Catalyst-Enhanced Chemical Vapor Deposition of Copper", Journal of The Electrochemical Society, Dec. 26, 2001, 109-113.

* cited by examiner

DUAL SILICIDE PROCESS USING RUTHENIUM SILICIDE

TECHNICAL FIELD

Embodiments of the present disclosure pertain to the field of semiconductor devices and semiconductor device manufacturing. More particularly, embodiments of the disclosure relate to methods of selectively forming silicide layers.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (finFET) structure, and a gate all around (GAA) structure. Logic gate performance is related to the characteristics of the materials used as well as the thickness and area of the structural layers. However, as some gate characteristics are adjusted to accommodate device scaling, challenges arise.

To improve contact resistance (Rc), there is a need to reduce the Schottky barrier height on both n-type and p-type junctions. Current CVD titanium silicide (TiSi) is preferentially n-type. Typical dual silicide flows, however, are very complex, requiring separate opening of contacts to n+ and p+ junctions, doubling lithography and etching steps. There is a need in the art for methods of to improving the Schottky barrier height on p-type transistors without inducing process complexity.

SUMMARY

One or more embodiments of the disclosure are directed to a method of forming a semiconductor structure. The method comprises selectively depositing a ruthenium silicide (RuSi) layer on a p transistor of a substrate, the substrate comprising an n transistor and the p transistor and having a first opening over the n transistor and a second opening over the p transistor; and forming a titanium silicide (TiSi) layer on the n transistor and on the p transistor.

Another embodiment of the disclosure is directed to a method of forming a semiconductor structure. In one or more embodiments, the method comprises: patterning a substrate to form a first opening and a second opening, the substrate comprising an n transistor and a p transistor, the first opening over the n transistor and the second opening over the p transistor; pre-cleaning the substrate; selectively depositing a ruthenium silicide (RuSi) layer on the p transistor by catalyst enhanced CVD process; forming a titanium silicide (TiSi) layer on the n transistor and on the p transistor; forming a barrier layer on the titanium silicide (TiSi) layer; and depositing a gap fill material in the first opening and in the second opening.

Further embodiments of the disclosure are directed to a semiconductor structure. The semiconductor structure comprises an n transistor and a p transistor; a ruthenium silicide (RuSi) layer on the p transistor; a titanium silicide (TiSi) layer on one or more of the n transistor and the p transistor; optionally, a barrier layer on one or more of the titanium silicide (TiSi) layer and the ruthenium silicide (RuSi) layer; and a gap fill material.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

Figure 1:
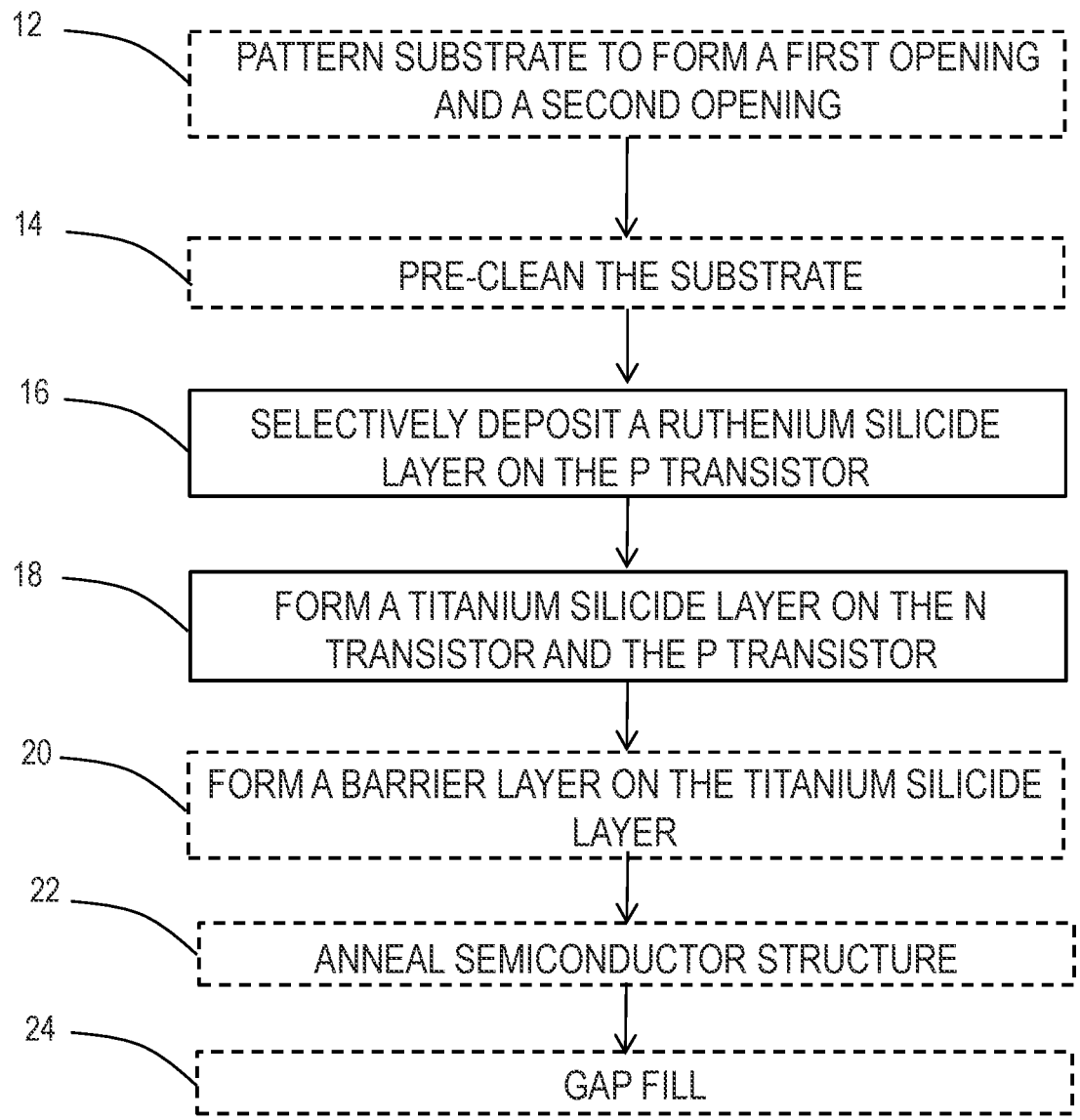
FIG. 1 illustrates a process flow diagram of a method according to one or more embodiments.
Figure 2:
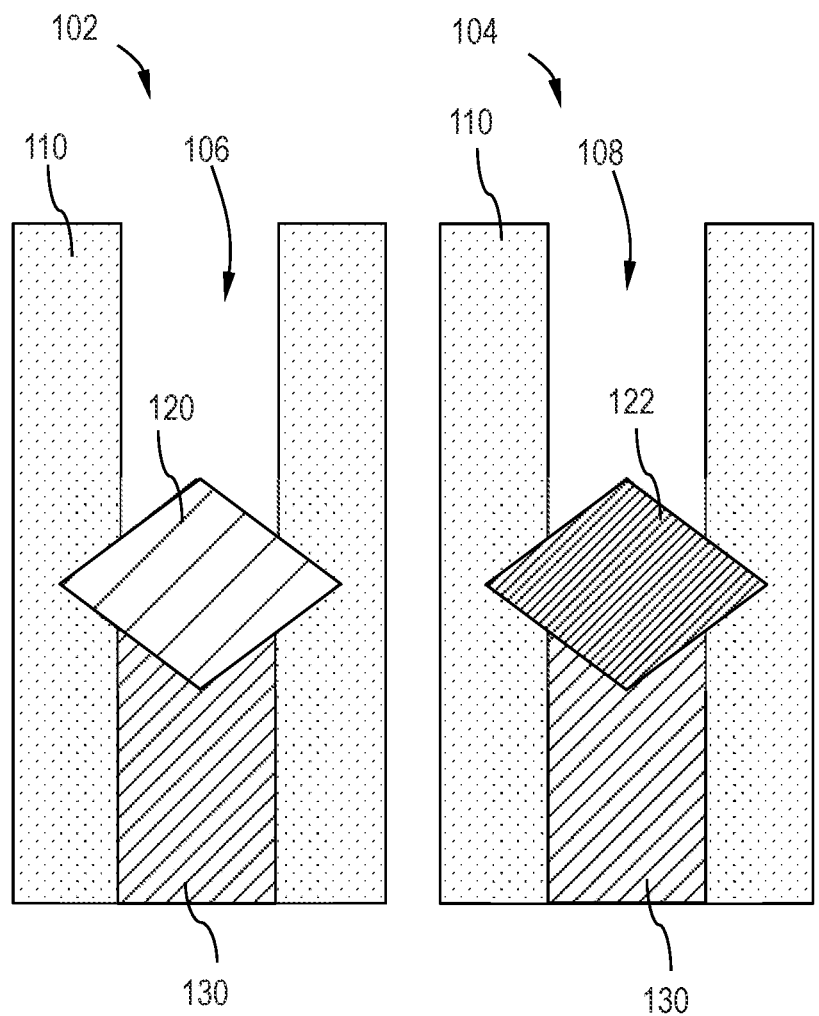
FIG. 2 illustrates a semiconductor structure in accordance with one or more embodiments of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

As use herein, the term "substrate," refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

Additionally, the term "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, dielectric materials, other conductive materials, or combinations thereof, depending on the application. In some embodiments, the substrate comprises silicon (Si), ruthenium (Ru), cobalt (Co), tungsten (W), molybdenum (Mo), silicon phosphide (SiP), titanium silicon (TiSi), titanium nitride (TiN), titanium aluminide (TiAl), silicon germanium (SiGe), silicon germanium boron (SiGeB), hafnium oxide ($HfO_2$), aluminum oxide ($Al_2O_3$) or combinations thereof. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates.

As used in this specification and the appended claims, the term "selectively" refers to process which acts on a first surface with a greater effect than another second surface. Such a process would be described as acting "selectively" on the first surface over the second surface. The term "over" used in this regard does not imply a physical orientation of one surface on top of another surface, rather a relationship of the thermodynamic or kinetic properties of the chemical reaction with one surface relative to the other surface.

According to one or more embodiments, the term "on", with respect to a film or a layer of a film, includes the film or layer being directly on a surface, for example, a substrate surface, as well as there being one or more underlayers between the film or layer and the surface, for example the substrate surface. Thus, in one or more embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

As used herein, the term "substrate surface" refers to any substrate surface upon which a layer may be formed. The substrate surface may have one or more features formed therein, one or more layers formed thereon, and combinations thereof. The shape of the feature can be any suitable shape including, but not limited to, peaks, trenches, and cylindrical vias. As used in this regard, the term "feature" refers to any intentional surface irregularity. Suitable examples of features include but are not limited to trenches which have a top, two sidewalls and a bottom, peaks which have a top and two sidewalls extending upward from a surface, and vias which have sidewalls extending down from a surface with an open bottom.

As used herein, the term "processing chamber" includes portions of a processing chamber adjacent the substrate surface without encompassing the complete interior volume of the processing chamber. For example, in a sector of a spatially separated processing chamber, the portion of the processing chamber adjacent the substrate surface is purged of one or more reactive compounds by any suitable technique including, but not limited to, moving the substrate through a gas curtain to a portion or sector of the processing chamber that contains none or substantially none of the reactive compounds.

As used herein, the term "atomic layer deposition" or "cyclical deposition" refers to the sequential exposure of two or more reactive compounds to deposit a layer of material on a substrate surface. The substrate, or portion of the substrate surface is exposed sequentially to the two or more reactive compounds which are introduced into a reaction zone of a processing chamber. The sequential exposure of the reactive gases prevents or minimizes gas phase reactions between the reactive gases. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness. In one or more embodiments, the time-domain ALD process can be performed with more than two reactive compounds in a predetermined sequence.

In an aspect of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas. In one or more embodiments, the spatial ALD process can be performed with more than two reactive compounds in a predetermined sequence.

In some embodiments, the substrate surface is exposed to the first reactive compound and the second reactive compound substantially sequentially. As used herein throughout the specification, "substantially sequentially" means that most of the duration of the first reactive compound exposure does not overlap with the second reactive compound exposure, although there may be some overlap.

As used herein, the term "chemical vapor deposition" refers to the exposure of at least one reactive compound to deposit a layer of material on the substrate surface. In some embodiments, the chemical vapor deposition (CVD) process comprises mixing the two or more reactive compounds in the processing chamber to allow gas phase reactions of the reactive compounds and deposition. In some embodiments, the CVD process comprises exposing the substrate surface to two or more reactive compounds simultaneously. In some embodiments, the CVD process comprises exposing the substrate surface to a first reactive compound continuously with an intermittent exposure to a second reactive compound. In some embodiments, the substrate surface undergoes the CVD reaction to deposit a film having a predetermined thickness. In the CVD process, the film can be deposited in one exposure to the mixed reactive compounds, or can be multiple exposures to the mixed reactive compounds with purges between. In some embodiments, the substrate surface is exposed to the first reactive compound and the second reactive compound substantially simultaneously.

As used herein throughout the specification, "substantially simultaneously" means that most of the duration of the first reactive compound exposure overlaps with the second reactive compound exposure.

As used herein, the term "purging" includes any suitable purge process that removes unreacted precursor, reaction products and by-products from the process region. The suitable purge process includes moving the substrate through a gas curtain to a portion or sector of the processing region that contains none or substantially none of the reactant. In one or more embodiments, purging the processing chamber comprises applying a vacuum. In some embodiments, purging the processing region comprises flowing a purge gas over the substrate. In some embodiments, the purge process comprises flowing an inert gas. In one or more embodiments, the purge gas is selected from one or more of nitrogen ($N_2$), helium (He), and argon (Ar). In some embodiments, the first reactive compound is purged from the reaction chamber for a time duration in a range of from 0.1 seconds to 30 seconds, from 0.1 seconds to 10 seconds, from 0.1 seconds to 5 seconds, from 0.5 seconds to 30 seconds, from 0.5 seconds to 10 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds before exposing the substrate to the second reactive compound.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is and should not be construed or interpreted as limiting the scope of the embodiments described herein.

As used herein, the terms "liner" or "barrier layer" refer to a layer conformably formed along at least a portion of the sidewalls and/or lower surface of an opening such that a substantial portion of the opening prior to the deposition of the layer remains unfilled after deposition of the layer. The liner may be formed along the entirety of the sidewalls and lower surface of the opening. The liner can be formed by any process known to a person skilled in the art. In some embodiments, the liner comprises a metal nitride, a PVD metal or combinations thereof. In one or more embodiments, the "liner" or "barrier layer" can also be formed selectively at the bottom of the structure.

Transistors are circuit components or elements that are often formed on semiconductor devices. Many transistors may be formed on a semiconductor device in addition to capacitors, inductors, resistors, diodes, conductive lines, or other elements, depending upon the circuit design. The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals.

Generally, a transistor includes a gate formed between source and drain regions. The source and drain regions may include a doped region of a substrate and may exhibit a doping profile suitable for a particular application. The gate is positioned over the channel region and may include a gate dielectric interposed between a gate electrode and the channel region in the substrate.

As used herein, the term "field effect transistor" or "FET" refers to a transistor that uses an electric field to control the electrical behavior of the device. Field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated Is and current entering the channel at the drain (D) is designated ID. Drain-to-source voltage is designated $V_{DS}$. By applying voltage to gate (G), the current entering the channel at the drain (i.e., $I_D$) can be controlled.

The metal—oxide—semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region.

The source is so named because it is the source of the charge carriers (electrons for n-channel, holes for p-channel) that flow through the channel; similarly, the drain is where the charge carriers leave the channel.

Embodiments of the disclosure provide semiconductor structures and methods for forming a semiconductor structure. For improved contact resistance ($R_c$), there is a need to reduce the Schottky barrier height on both n-type and p-type junctions. Current CVD titanium silicide (TiSi) is preferentially n-type. There is a need for p-type silicides. Typical dual silicide flows, however, are very complex, requiring separate opening of contacts to n+ and p+ junctions, doubling lithography and etching steps. Accordingly, one or more embodiments advantageously provide integration schemes to produce dual silicides on the nFET and pFET contacts. In one or more embodiments, selective ruthenium (Ru) growth is used to improve the Schottky barrier height on p-type without inducing process complexity. A catalyst enhanced CVD process may be used to selectively deposit ruthenium on the p transistor.

The embodiments of the disclosure are described by way of the Figures, which illustrate processes for forming dual silicides on the nFET and pFET contacts. FIG. 1 illustrates a process flow diagram of a method 10 of forming a semiconductor structure. FIG. 1 illustrates a method of forming any of the semiconductor structures of one or more embodiments shown in FIGS. 2-6.

In one or more embodiments, the method 10 of forming a semiconductor structure comprises, at operation 12, patterning a substrate to form a first opening and a second opening, the substrate comprising an n transistor and a p transistor, the first opening over the n transistor and the second opening over the p transistor. At operation 14, the method 10 comprises pre-cleaning the substrate. At operation 16, the method 10 comprises selectively depositing a ruthenium silicide (RuSi) layer on the p transistor. At operation 18, the method 10 comprises forming a titanium silicide (TiSi) layer on the n transistor and on the p transistor. At operation 20, the method 10 comprises optionally forming a barrier layer on the titanium silicide (TiSi) layer. At operation 22, the method 10 comprises annealing the semiconductor structure. At operation 24, the method 10 comprises gap filling.

With reference to FIGS. 1 and 2-6, the method, at operation 12, comprises patterning a substrate 100 to form at least one of a first opening 106 and a second opening 108. In one or more embodiments, patterning the substrate comprises using one or more patterning techniques known to one of ordinary skill in the art of microelectronic device manufacturing. In some embodiments, the semiconductor structure 100 is provided and no patterning to form the semiconductor structure 100 is required.

With reference to FIGS. 2-6, a semiconductor structure 100 is shown. The semiconductor structure 100 comprises an n transistor 102 and a p transistor 104. In one or more embodiments, each of the n transistor 102 and the p transistor 104 comprise a dielectric material 110, a source/drain material 120, 122, and a substrate 130.

In one or more embodiments, the dielectric material 110 may comprise any suitable dielectric material known to the skilled artisan. As used herein, the term "dielectric material" refers to an electrical insulator that can be polarized in an electric field. In some embodiments, the dielectric material 110 comprises one or more of silicon, silicon oxide, silicon nitride, silicon carbide, and low-K dielectrics. As used herein, terms such as "silicon oxide" and "silicon nitride" refer to materials comprising silicon and oxygen or silicon and nitrogen. "Silicon oxide" and "silicon nitride" should not be understood to imply any stoichiometric ratio. Stated differently, a dielectric material comprising silicon oxide or silicon nitride may be stoichiometric or non-stoichiometric, silicon-rich, or silicon-poor. In some embodiments, the dielectric material 110 comprises silicon oxide ($SiO_2$).

In some embodiments, the n transistor 102 and the p transistor 104 comprise source and drain contacts. In one or more embodiments, the source/drain material 120, 122 may have more than one layer.

In one or more specific embodiments, the source/drain material 120 of the n transistor 102 comprises silicon (Si). The source/drain 120 material of the n transistor 102 may be doped or undoped. In one or more embodiments, the source/drain material 120 of the n transistor 102 comprises silicon (Si) doped with phosphorous (P).

In one or more embodiments, the source/drain material 122 of the p transistor 104 comprises silicon germanium (SiGe). In one or more embodiments, the silicon germanium (Ge) may have any suitable concentration of germanium. In some embodiments, the silicon germanium (SiGe) has a concentration of germanium in a range of from 10% to 100%, or in a range of from 20% to 60%. The source/drain 122 material of the p transistor 104 may be doped or undoped. In one or more embodiments, the source/drain material 122 of the p transistor 104 comprises silicon germanium (SiGe) doped with boron (B).

Referring to FIGS. 2-6, in one or more embodiments, there is a first opening 106 over the n transistor 102, and there is a second opening 108 over the p transistor 104. The first opening 106 and the second opening 108 can have any suitable aspect ratio (ratio of the depth of the opening to the width of the opening). In one or more embodiments, the first opening 106 and the second opening 108 may independently have an aspect ratio in a range of from 3:1 to 15:1, or in a range of from 6:1 to 15:1, or in a range of from 9:1 to 15:1, or in a range a range of from 12:1 to 15:1. In one or more embodiments, the first opening 106 and the second opening 108 may independently have an aspect ratio greater than 10:1.

In one or more embodiments, at operation 14, the method comprises pre-cleaning the substrate. In one or more embodiments, keeping the pre-cleaning process under vacuum ensures that no oxide is introduced/formed on the substrate surface during the method. In some embodiments, pre-cleaning the substrate (or surface of the substrate) removes oxides from the surface. In some embodiments, the oxides are native oxides. In some embodiments, cleaning the surface forms a surface that is substantially free of oxides. As used in this manner, the term "substantially free of oxides" means that there are less than or equal to 5%, 2%, 1% or 0.5% of oxygen atoms on the surface. In one or more embodiments, anisotropic etching is used to remove oxide from the surface. In one or more embodiments, anisotropic etching removes oxide more from the surface of the source/drain material than the dielectric material. In one or more embodiments, pre-cleaning the surface forms a source/drain material that is substantially free of oxide.

In one or more embodiments, anisotropic etching removes oxide more from the surface of the source/drain material 120, 122 than the dielectric material 110. In one or more embodiments, cleaning the structure forms a source/drain material 120, 122 that is substantially free of oxide.

Figure 3:
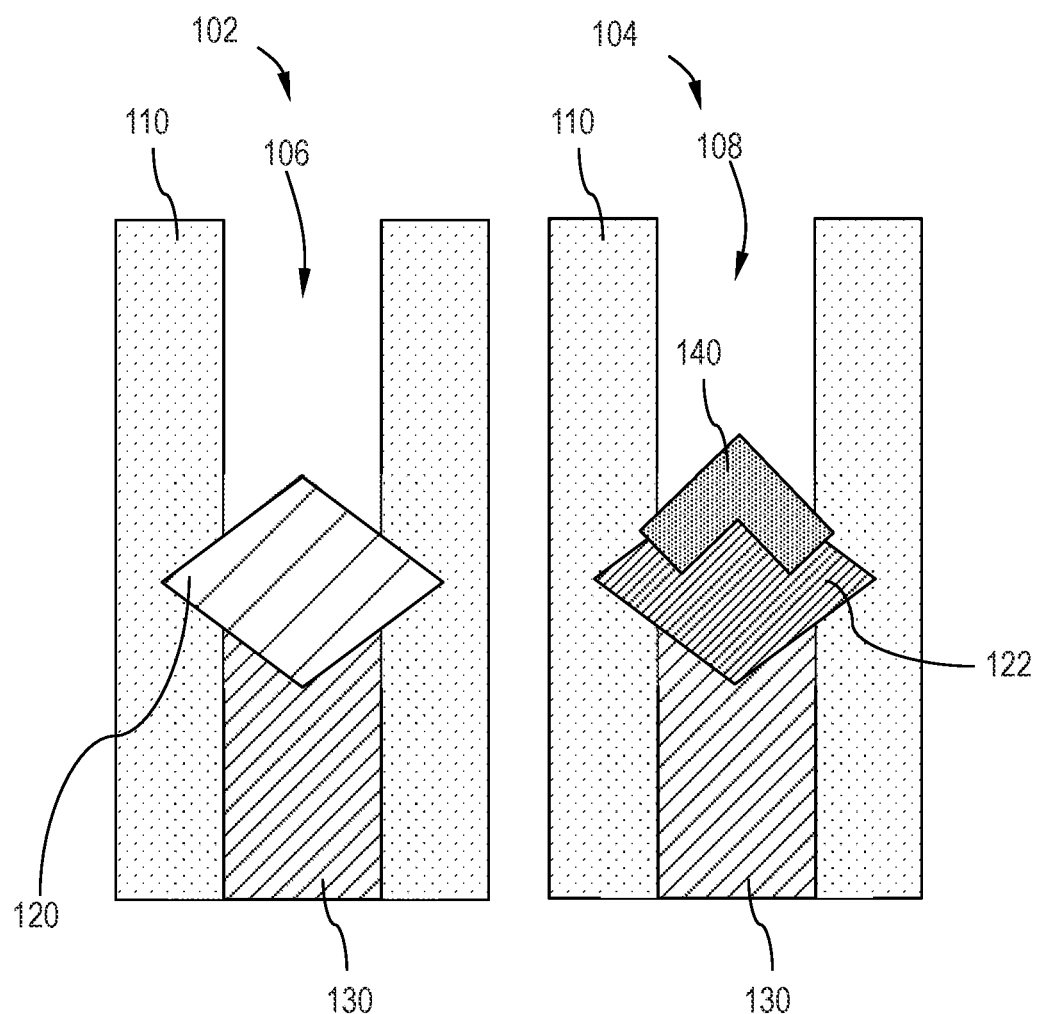
FIG. 3 illustrates a semiconductor structure in accordance with one or more embodiments of the disclosure.

With reference to FIG. 1 and FIG. 3, at operation 16, a ruthenium silicide (RuSi) layer 140 is selectively deposited on the p transistor 104 source/drain 122. In one or more embodiments, it was advantageously found that ruthenium (Ru) grows preferentially on silicon germanium (SiGe) versus silicon (Si), allowing for an integration flow which does not increase the number of lithography and etch steps. In one or more embodiments, the ruthenium silicide (RuSi) layer is selectively formed on the silicon germanium (SiGe) doped with boron (B) source/drain 122 of the p transistor and not on the silicon source/drain 120 of the n-transistor.

In one or more embodiments, the ruthenium silicide layer 140 may be formed by any suitable means. In one or more embodiments, a ruthenium silicide layer 140 is deposited on the p transistor by a catalyst enhanced CVD process.

In one or more embodiments, the ruthenium silicide layer 140 is selectively deposited on the source/drain material 122 of the p-transistor and not on the source/drain material 120 of the n-transistor. As used in this specification and the appended claims, the term "selectively depositing a film on one surface over another surface", and the like, means that a first amount of the film is deposited on the first surface and a second amount of film is deposited on the second surface, where the second amount of film is less than the first amount of film, or no film is deposited on the second surface.

The selectivity of a deposition process is generally expressed as a multiple of growth rate. For example, if one surface is grown (or deposited on) twenty-five times faster than a different surface, the process would be described as having a selectivity of 25:1. In this regard, higher ratios indicate more selective processes.

In one or more embodiments, the substrate 100 is optionally exposed to a blocking compound. This process step is described more fully below and may be useful for controlling the selectivity of the deposition process on a substrate comprising both a metal surface and a dielectric surface.

A ruthenium silicide layer 140 is formed on the substrate. The process of forming the ruthenium silicide layer 140 may begin by soaking the substrate with a catalytic gas. The catalytic gas comprises an alkyl halide and is exposed to the substrate for a first period of time.

The alkyl halide may be any suitable reactant to adsorb a layer on the substrate for later reaction. Stated differently, soaking the substrate in the alkyl halide forms an activated substrate surface. In some embodiments, the alkyl halide comprises carbon and halogen. In some embodiments, the halogen comprises bromine or iodine. In some embodiments, the halogen is insoluble in the metal film. As used in this regard, a halogen which is insoluble in a metal film comprises less than or equal to about 2%, less than or equal to about 1%, or less than or equal to about 0.5% of the metal film on an atomic basis. In some embodiments, the alkyl halide has the general formula R-X, where R is an alkyl, alkenyl, aryl, or other carbonaceous group. In some embodiments, R comprises one to two, one to four, or one to six carbon atoms. In some embodiments, the alkyl halide comprises or consists essentially of iodoethane ($H_5C_2I$) or diiodomethane ($CH_2I_2$). As used in this regard, an alkyl halide which consists essentially of a stated species comprises greater than 95%, 98%, 99% or 99.5% of the stated species on a molar basis, excluding any inert diluent gases.

The alkyl halide may be provided to the processing chamber in one or more pulses or continuously. In some embodiments, the alkyl halide is provided with an inert carrier gas and is referred to the alkyl halide containing gas. The flow rate of the alkyl halide or alkyl halide containing gas can be any suitable flow rate including, but not limited to, flow rates in the range of about 1 to about 5000 sccm, or in the range of about 2 to about 4000 sccm, or in the range of about 3 to about 3000 sccm or in the range of about 5 to about 2000 sccm. The alkyl halide or alkyl halide containing gas can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

The period of time that the substrate is soaked in the alkyl halide may be any suitable amount of time necessary to allow the alkyl halide to form an adequate adsorption layer on the substrate surface(s). For example, the alkyl halide may be allowed to soak the substrate for a period of greater than about 3 seconds or greater than about 5 seconds. In some embodiments, the soak period is in a range of about 3 seconds to about 60 seconds.

In some embodiments, an inert gas may additionally be provided to the process chamber at the same time as the alkyl halide containing gas. The inert gas may be mixed with the alkyl halide (e.g., as a diluent gas) or be provided separately and can be pulsed or of a constant flow. The inert gas may be any inert gas, for example, such as argon, helium, neon, or combinations thereof.

In addition to the foregoing, additional process parameters may be regulated while exposing the substrate to the alkyl halide containing gas. For example, in some embodiments, the process chamber may be maintained at a pressure of about 0.2 to about 100 Torr, or in the range of about 0.3 to about 90 Torr, or in the range of about 0.5 to about 80 Torr, or in the range of about 1 to about 50 Torr. In some embodiments, the process chamber is maintained at a pressure of about 5 Torr.

The substrate 100 is then exposed to a second process gas for a second period of time. The second process gas comprises a ruthenium precursor which reacts with the adsorbed layer of alkyl halide or halogen on the substrate surface to deposit a ruthenium film. The second reactive gas may also be referred to as the metal precursor gas.

The ruthenium precursor may be any suitable precursor to react with the adsorbed alkyl halide layer or halogen layer on the substrate. In some embodiments, the ruthenium precursor comprises a metal center and one or more ligands. In some embodiments, the metal center comprises one or more metal atoms. Stated differently, in some embodiments, the metal precursor is one or more of a dimer, trimer, or tetramer.

The ruthenium precursor can be any suitable precursor with a decomposition temperature above the deposition temperature. In some embodiments, the ruthenium precursor comprises substantially no oxygen or nitrogen atoms. Accordingly, in these embodiments, the metal precursor comprises no carbonyl, oxo, amine, or imine ligands. Within these parameters, the number of ligands and types of ligands on the ruthenium precursor can vary, based on, for example, the oxidation state of the ruthenium atom. The ruthenium precursor can be homoleptic or heteroleptic. In some embodiments, the ruthenium precursor comprises at least one ligand comprising an optionally alkyl substituted cyclopentadiene (Cp) ring. In some embodiments, the ruthenium precursor comprises at least one ligand comprising an optionally alkyl substituted benzene ring. In some embodiments, the ruthenium precursor comprises at least one p-cymene ligand. In some embodiments, the ruthenium precursor comprises at least one ligand comprising an open or closed diene. In some embodiments, the metal precursor comprises at least one 1,3-butadiene ligand. In some embodiments, the metal precursor comprises at least one 1,5-hexadiene ligand.

The ruthenium precursor is delivered to the processing chamber as a ruthenium precursor gas. The ruthenium precursor gas may be provided in one or more pulses or continuously. The flow rate of the ruthenium precursor gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm.

The ruthenium precursor gas can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

The period of time that the substrate is exposed to the ruthenium precursor gas may be any suitable amount of time necessary to allow the metal precursor to react with the adsorbed halogen on the substrate surface. For example, the process gas may be flowed into the process chamber for a period of greater than or equal to about 60 seconds. In some embodiments, the period of exposure to the ruthenium precursor is about 100 seconds, about 200 seconds, about 300 seconds, about 400 seconds or about 500 seconds.

The temperature of the substrate during exposure to the ruthenium precursor can be controlled, for example, by setting the temperature of the substrate support or susceptor. This temperature is also referred to as the deposition temperature. In some embodiments the substrate is held at a temperature in the range of about 0° C. to about 600° C., or in the range of about 25° C. to about 500° C., or in the range of about 50° C. to about 450° C., or in the range of about 100° C. to about 400° C., or in the range of about 200° C. to about 400° C., or in the range of about 250° C. to about 350° C. In some embodiments, the substrate is maintained at a temperature below the decomposition temperature of the metal precursor. In some embodiments, the substrate is maintained at a temperature below the decomposition temperature of the alkyl halide. In some embodiments, the substrate is maintained at a temperature between the decomposition temperature of the alkyl halide and the decomposition temperature of the metal precursor.

In one or more embodiments, the substrate is maintained at a temperature less than or equal to about 350° C., or less than or equal to about 310° C., or less than or equal to about 300° C., or less than or equal to about 250° C., or less than or equal to about 200° C. In one or more embodiments, the substrate is maintained at a temperature greater than or equal to about 200° C., or greater than or equal to about 300° C., or greater than about 350° C. In some embodiments, the substrate is maintained at a temperature in a range of from about 200° C. to about 310° C.

In some embodiments, an inert gas may additionally be provided to the process chamber at the same time as the ruthenium precursor gas. The inert gas may be mixed with the ruthenium precursor gas (e.g., as a diluent gas) or be provided separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, or combinations thereof.

The deposition process is performed as a thermal process without the use of plasma reactants. Stated differently, the method is performed without plasma.

In one or more embodiments, it is determined whether the ruthenium film has achieved a predetermined thickness. If the predetermined thickness has not been achieved, the method returns to continue exposing the substrate to the ruthenium precursor until the predetermined thickness is reached. In some embodiments, the ruthenium film may be deposited to form a total layer thickness of about 10 Å to about 10,000 Å, or in some embodiments, about 20 Å to about 1000 Å, or in some embodiments, about 50 Å to about 200 Å.

In one or more embodiments, once the ruthenium film has reached its predetermined thickness, the ruthenium film may be exposed to a reactant to form the ruthenium silicide layer 140. In one or more embodiments, the reactant comprises an oxidizing agent, a reducing agent, or combinations thereof. In some embodiments, the reactant comprises hydrogen ($H_2$), ammonia ($NH_3$), silane, polysilane, or combinations thereof. In some embodiments, the silane is selected from one or more of disilane, trisilane, tetrasilane, higher order silanes, and substituted silane. In specific embodiments, the reactant comprises a silane to form the ruthenium silicide (RuSi) layer 140. In one or more embodiments, the reactant is flowed over the surface using a carrier gas. In some embodiments, the carrier gas in an inert gas. In some embodiments, the inert gas comprises one or more of $N_2$, Ar, and He. In other embodiments, the reactant gas may be flowed continuously and the molybdenum precursor flow to the chamber is turned on and off.

In other embodiments, the ruthenium film may be annealed. The annealing may occur at any suitable temperature in any suitable atmosphere. In some embodiments, the ruthenium film is annealed in an atmosphere of hydrogen ($H_2$) gas at ambient temperature.

In one or more embodiments, the ruthenium silicide layer 140 may have any suitable thickness. In some embodiments, the ruthenium silicide layer 140 has a thickness in a range of from 20 Å to about 100 Å, or in a range of from about 30 Å to about 90 Å, or in a range of from about 40 Å to about 80 Å, or in a range of from about 50 Å to about 70 Å. In one or more embodiments, the ruthenium silicide (RuSi) layer 140 has a thickness of about 40 Å. The ruthenium silicide (RuSi) layer 140 on the p transistor 102 has a Schottky barrier height in a range of from about 0.65 eV to about 0.95 eV.

Figure 4:
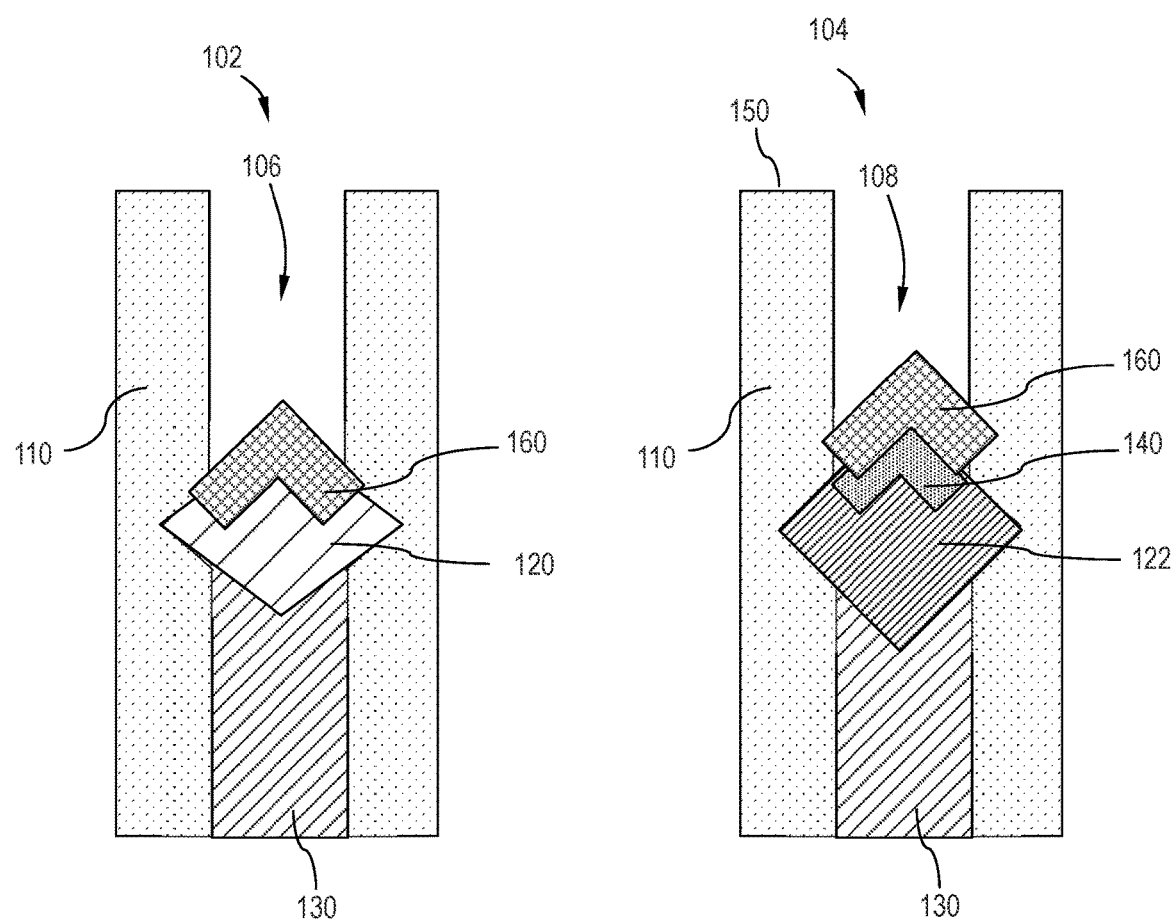
FIG. 4 illustrates a semiconductor structure in accordance with one or more embodiments of the disclosure.

Referring to FIG. 1 and FIG. 4, at operation 18, a titanium silicide (TiSi) layer 160 is deposited on the source/drain 120 of the n transistor 102 and on the source/drain 122 of the p transistor. In one or more embodiments, the titanium silicide (TiSi) layer 160 may have any suitable thickness. In some embodiments, the titanium silicide (TiSi) layer 160 has a thickness in a range of from 20 Å to about 100 Å, or in a range of from about 30 Å to about 90 Å, or in a range of from about 40 Å to about 80 Å, or in a range of from about 50 Å to about 70 Å. In one or more embodiments, the titanium silicide (TiSi) layer 160 has a thickness of about 40 Å.

The titanium silicide (TiSi) layer 160 may be formed according to any suitable process known to the skilled artisan. In one or more embodiments, the structure 100 is first cleaned to remove oxides from the surface. In some embodiments, the oxides are native oxide. In some embodiments, cleaning the surface forms a surface that is substantially free of oxide. As used in this manner, the term "substantially free of oxide" means that there are less than or equal to 5%, 2%, 1% or 0.5% of oxygen atoms on the surface. In one or more embodiments, anisotropic etching is used to remove oxide from the surface.

In one or more embodiments, to form the titanium silicide (TiSi) layer 160, a metal film is selectively formed on the source/drain 120 of the n transistor 102 and on the source/drain 122 of the p transistor, e.g., on the ruthenium silicide layer 140. In some embodiments, the structure 100 is exposed to a metal precursor and a reactant. The metal film can be deposited by an ALD deposition process, a CVD deposition process, a plasma enhanced CVD process, or combinations thereof. In some embodiments, the metal film comprises a titanium silicide (TiSi) film.

In one or more embodiments, the metal precursor comprises a titanium precursor. In some embodiments, the titanium precursor comprises a titanium halide. In some embodiments, the titanium halide comprises titanium fluoride, titanium chloride, or combinations thereof. In specific embodiments, the titanium precursor comprises titanium fluoride. In other specific embodiments, the titanium precursor comprises titanium chloride. In one or more embodiments, the precursor is flowed over the surface using a carrier gas. In some embodiments, the carrier gas is flowed through an ampoule comprising the precursor. In some embodiments, the carrier gas in an inert gas. In some embodiments, the inert gas comprises one or more of $N_2$, Ar, and He.

In one or more embodiments, the reactant comprises an oxidizing agent, a reducing agent, or combinations thereof. In some embodiments, the reactant comprises hydrogen ($H_2$), silane, polysilane, or combinations thereof. In some embodiments, the silane is selected from one or more of disilane, trisilane, tetrasilane, higher order silanes, and substituted silane. In specific embodiments, the reactant comprises a silane to form the titanium silicide (TiSi) layer 160. In one or more embodiments, the reactant is flowed over the surface using a carrier gas. In some embodiments, the carrier gas in an inert gas. In some embodiments, the inert gas comprises one or more of Ar and He. In other embodiments, the reactant gas may be flowed continuously and the molybdenum precursor flow to the chamber is turned on and off.

In other embodiments the titanium silicide film is formed by reacting titanium tetrachloride ($TiCl_4$), hydrogen ($H_2$), and plasma with the underlying silicon substrate. In one or more embodiments, an additional silicon source is not provided.

In one or more embodiments, the dual silicide integrated process described herein delivers greater than 0.2 eV work function difference between the n transistor 102 and the p transistor 104.

Figure 5:
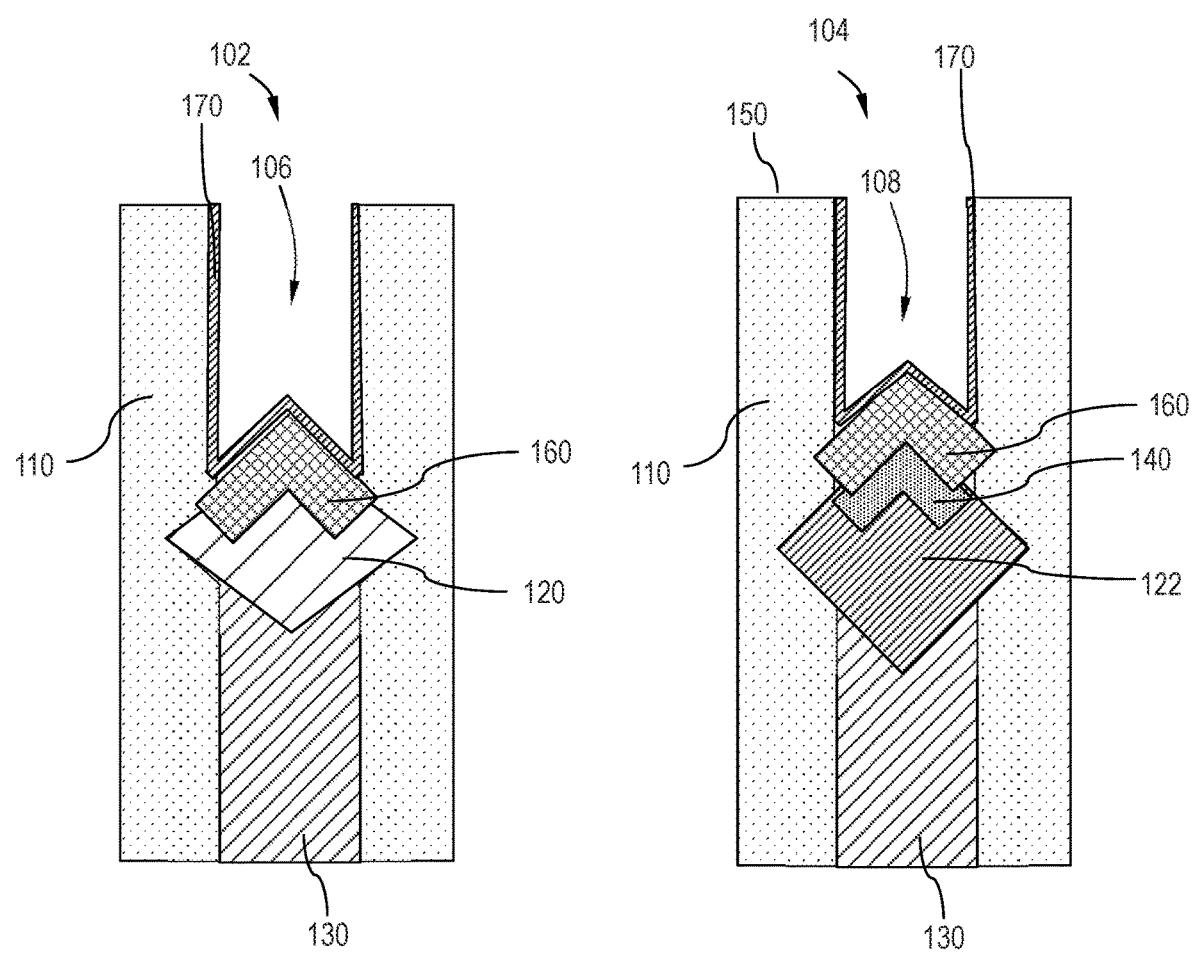
FIG. 5 illustrates a semiconductor structure in accordance with one or more embodiments of the disclosure.

Referring to FIG. 1 and FIG. 5, at operation 20, an optional barrier layer 170 may be formed on each of the n transistor 102 and the p transistor 104. The optional barrier layer 170 may comprise any suitable material known to the skilled artisan. In one or more embodiments, the optional barrier layer 170 comprises a PVD metal film. In one or more embodiments, the optional barrier layer 170 is selected from one or more of titanium nitride (TiN), tantalum nitride (TaN), tungsten nitride (WN), molybdenum nitride (MoN), PVD tungsten (W), PVD molybdenum (Mo), and PVD ruthenium (Ru). In one or more embodiments, the barrier layer 170 prevents formation of oxides on the titanium silicide (TiSi) layer 160. In one or more embodiments, the n transistor 102 having a barrier layer 170 formed thereon has a Schottky barrier height that is lower than an n transistor not having a barrier layer formed thereon. In one or more embodiments, the p transistor 104 having a barrier layer 170 formed thereon has a Schottky barrier height that is lower than a p transistor not having a barrier layer 170 formed thereon.

In additional embodiments, the barrier layer 170 is selectively formed on a top surface of titanium silicide (TiSi) layer 160 through the nitridation of the titanium silicide (TiSi) layer 160 by one or more of ammonia ($NH_3$) plasma, $N_2/H_2$ plasma, or the like.

Referring to FIG. 1, in another aspect of the disclosure, a method 10 of forming the semiconductor structure includes reducing the contact resistance of the semiconductor structure. In some embodiments, at operation 22, annealing the semiconductor structure 100 reduces the contact resistance. In one or more embodiments, annealing the semiconductor structure 100 produces a smooth surface.

The semiconductor structure 100 can be annealed by any process known to a person skilled in the art. In some embodiments, the semiconductor structure is annealed by a rapid thermal process (RTP). In one or more embodiments, the rapid thermal process (RTP) comprises annealing the semiconductor structure 100 to a temperature in a range of about 500° C. to about 700° C. In one or more embodiments, the rapid thermal process (RTP) comprises annealing the semiconductor structure 100 to a temperature of about 600° C.

In some embodiments, the annealed semiconductor structure has a root mean square (RMS) roughness in a range of from 4% to less than 30%, from 4% to less than 20%, from 4% to less than 10%, from 10% to less than 30%, from 10% to less than 20% or from 20% to less than 30%.

Figure 6:
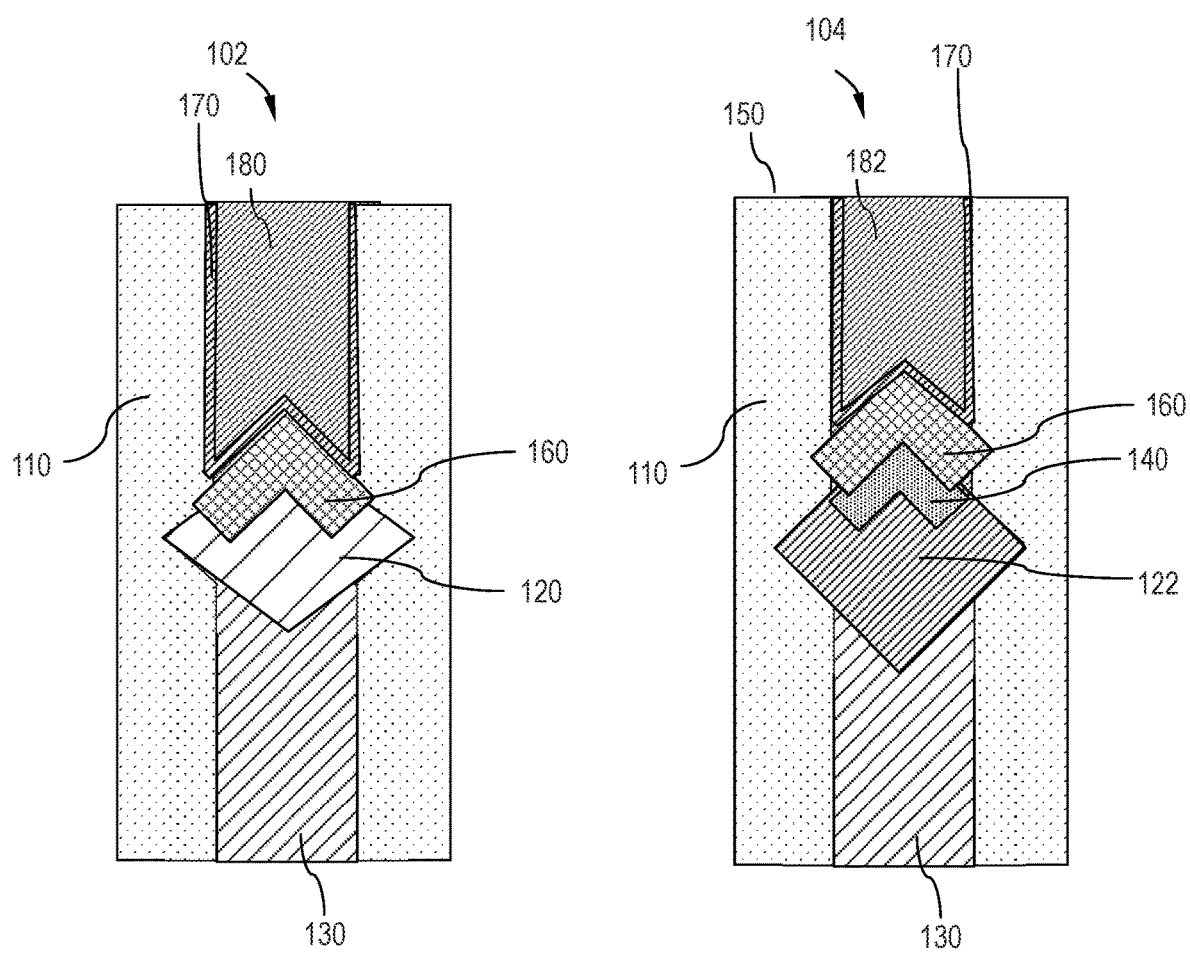
FIG. 6 illustrates a semiconductor structure in accordance with one or more embodiments of the disclosure.

With reference to FIG. 1 and FIG. 6, at operation 24, the first opening 106 over the n transistor 102 and the second opening 108 over the p transistor 104 are independently filled with a gap fill material 180 and a gap fill material 182, respectively. In one or more embodiments, the gap fill material 180 and the gap fill material 182 are substantially free of voids or seams. The gap fill material 180 and the gap fill material 182 may independently comprise any suitable gap fill materials known to the skilled artisan. In one or more embodiments, the gap fill material 180 and the gap fill material 182 independently comprise one or more of tungsten (W), molybdenum (Mo), cobalt (Co), and ruthenium (Ru). In one or more embodiments, the gap fill material 180 in the first opening 106 over the n transistor 102 is the same as the gap fill material 182 in the second opening 108 over the p transistor 104. In one or more embodiments, the gap fill material 180 in the first opening 106 over the n transistor 102 is different than the gap fill material 182 in the second opening 108 over the p transistor 104. In one or more embodiments, the gap fill material 180 and the gap fill material 182 are the same and comprise tungsten (W).

The gap filling process may comprise any suitable gap filling process known to the skilled artisan. In one or more embodiments, the gap filling process comprises exposing the semiconductor structure 100 to a metal precursor and a reactant. In some embodiments, the metal precursor comprises one or more of a molybdenum precursor, a tungsten precursor, a cobalt precursor, and a ruthenium precursor.

In some embodiments, the gap filling process is a bottom-up gap filling process. In other embodiments, the gap filling process comprises a conformal gap filling process.

Several well-known cluster tools which may be adapted for the present disclosure are the Endura®, the Olympia®, the Continuum®, and the Trillium®, all available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), plasma treatment, etch, pre-clean, chemical clean, thermal treatment such as RTP, plasma nitridation, degas, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods, and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a semiconductor structure, the method comprising:
  pre-cleaning a substrate, the substrate comprising an n transistor and a p transistor, the substrate having a first opening over the n transistor and a second opening over the p transistor, the n transistor having an n-type source/drain region comprising silicon (Si) doped with phosphorus (P) and the p transistor having a p-type source/drain region comprising silicon germanium (SiGe) doped with boron (B), the pre-cleaning forming a surface of the n-type source/drain region that is substantially free of oxide and a surface of the p-type source/drain region that is substantially free of oxide;
  selectively depositing a ruthenium silicide (RuSi) layer directly on the p-type source/drain region over the n-type source/drain region; and
  forming a titanium silicide (TiSi) layer on the n transistor and on the p transistor.

2. The method of claim 1, further comprising depositing a gap fill material independently in the first opening and in the second opening.

3. The method of claim 1, further comprising:
  prior to pre-cleaning the substrate, patterning the substrate to form the first opening and the second opening.

4. The method of claim 1, further comprising forming a barrier layer on the titanium silicide (TiSi) layer.

5. The method of claim 4, wherein the barrier layer comprises one or more of titanium nitride (TIN), tantalum nitride (TaN), tungsten nitride (WN), molybdenum nitride (MoN), PVD tungsten (W), PVD molybdenum (Mo), and PVD ruthenium (Ru).

6. The method of claim 2, wherein the gap fill material is substantially free of voids or seams.

7. The method of claim 2, wherein the gap fill material comprises one or more of tungsten (W), molybdenum (Mo), cobalt (Co), and ruthenium (Ru).

8. The method of claim 1, further comprising annealing the semiconductor structure.

9. The method of claim 1, wherein selectively depositing the ruthenium silicide layer comprises a catalyst enhanced CVD process.

10. The method of claim 9, wherein the catalyst enhanced CVD process comprises soaking the substrate in an alkyl halide to form an activated substrate surface and exposing the substrate to a ruthenium precursor while the substrate is maintained at a deposition temperature to form a ruthenium film.

11. A method of forming a semiconductor structure, the method comprising:

patterning a substrate to form a first opening and a second opening, the substrate comprising an n transistor and a p transistor, the first opening over the n transistor and the second opening over the p transistor, the n transistor having an n-type source/drain region and the p transistor having a p-type source/drain region, the n-type source/drain region comprising silicon (Si) doped with phosphorus (P), the p-type source/drain region comprising silicon germanium SiGe) doped with boron (B);

pre-cleaning the substrate to form the surface of the n-type source/drain region substantially free of oxide and the surface of the p-type source/drain region substantially free of oxide;

selectively depositing a ruthenium silicide (RuSi) layer directly on the p-type source/drain region of the p transistor by a catalyst enhanced CVD process;

forming a titanium silicide (TiSi) layer on the n transistor and on the p transistor;

forming a barrier layer on the titanium silicide (TiSi) layer; and depositing a gap fill material in the first opening and in the second opening.

12. The method of claim 11, wherein the catalyst enhanced CVD process comprises soaking the substrate in an alkyl halide to form an activated substrate surface and exposing the substrate to a ruthenium precursor while the substrate is maintained at a deposition temperature to form a ruthenium film.

13. The method of claim 11, further comprising annealing the semiconductor structure.

14. The method of claim 11, wherein the barrier layer comprises one or more of titanium nitride (TiN), tantalum nitride (TaN), tungsten nitride (WN), molybdenum nitride (MoN), PVD tungsten (W), PVD molybdenum (Mo), and PVD ruthenium (Ru).

15. The method of claim 11, wherein the gap fill material comprises one or more of tungsten (W), molybdenum (Mo), cobalt (Co), and ruthenium (Ru).

* * * * *